(12) United States Patent
Hwang et al.

(10) Patent No.: US 11,443,672 B2
(45) Date of Patent: Sep. 13, 2022

(54) DATA DRIVER, DISPLAY APPARATUS INCLUDING THE SAME AND METHOD OF DRIVING DISPLAY PANEL USING THE SAME

(71) Applicants: Samsung Display Co., Ltd., Yongin-Si (KR); Korea University Research and Business Foundation, Seoul (KR)

(72) Inventors: Young-Soo Hwang, Hwaseong-si (KR); Joon-Chul Goh, Suwon-si (KR); Ohjo Kwon, Suwon-si (KR); Jeongmin Kim, Seoul (KR); Bonghyun You, Seoul (KR); Hyung-Min Lee, Seoul (KR); Seung Hun Choi, Gunpo-si (KR)

(73) Assignees: SAMSUNG DISPLAY CO., LTD.; KOREA UNIVERSITY RESEARCH AND BUSINESS FOUNDATION

( * ) Notice: Subject to any disclaimer, the term of this patent is extended or adjusted under 35 U.S.C. 154(b) by 0 days.

(21) Appl. No.: 17/241,746

(22) Filed: Apr. 27, 2021

(65) Prior Publication Data
US 2021/0335182 A1    Oct. 28, 2021

(30) Foreign Application Priority Data
Apr. 28, 2020    (KR) .................... 10-2020-0051673

(51) Int. Cl.
*G09G 3/20*    (2006.01)
*H03M 1/66*    (2006.01)

(52) U.S. Cl.
CPC ....... *G09G 3/20* (2013.01); *G09G 2300/0857* (2013.01); *G09G 2310/0275* (2013.01); *G09G 2310/0291* (2013.01); *G09G 2330/021* (2013.01); *H03M 1/66* (2013.01)

(58) Field of Classification Search
CPC ....... G09G 2310/0291; G09G 2340/16; G09G 2300/0857; G09G 3/3275
See application file for complete search history.

(56) References Cited

U.S. PATENT DOCUMENTS

| 2008/0278473 | A1  | 11/2008 | An |
| 2012/0026152 | A1* | 2/2012  | Chung ................. G09G 3/3688 345/212 |
| 2016/0049133 | A1  | 2/2016  | Park et al. |
| 2016/0093270 | A1* | 3/2016  | Lee ...................... G09G 3/3688 345/82 |

FOREIGN PATENT DOCUMENTS

| KR | 10-1243814 B1   | 3/2013  |
| KR | 10-1379937 B1   | 4/2014  |
| KR | 10-2016-0037010 A | 4/2016 |
| KR | 10-1640448 B1   | 7/2016  |
| KR | 10-2055841 B1   | 12/2019 |

* cited by examiner

*Primary Examiner* — Gerald Johnson
(74) *Attorney, Agent, or Firm* — Innovation Counsel LLP

(57) ABSTRACT

A data driver includes a digital to analog converter, a buffer and a buffer controller. The digital to analog converter is configured to receive a data signal having a digital type and to convert the data signal into a data voltage having an analog type. The buffer is configured to buffer the data voltage and to output the data voltage. The buffer controller is configured to determine a parameter of the buffer based on previous line data of the data signal and present line data of the data signal.

17 Claims, 8 Drawing Sheets

FIG. 8

| \| VA − VB \| | SW11/ SW12 | SW21/ SW22 | BIAS CURRENT |
|---|---|---|---|
| $\|VA - VB\| \leq \frac{VDD}{4}$ | OFF | OFF | IB1 |
| $\frac{VDD}{4} < \|VA - VB\| \leq \frac{VDD}{2}$ | ON | OFF | IB1 + IB2 |
| $\frac{VDD}{2} < \|VA - VB\| \leq \frac{3VDD}{4}$ | OFF | ON | IB1 + IB3 |
| $\|VA - VB\| > \frac{3VDD}{4}$ | ON | ON | IB1 + IB2 + IB3 |

DATA DRIVER, DISPLAY APPARATUS INCLUDING THE SAME AND METHOD OF DRIVING DISPLAY PANEL USING THE SAME

PRIORITY STATEMENT

This application claims priority under 35 U.S.C. § 119 to Korean Patent Application No. 10-2020-0051673, filed on Apr. 28, 2020 in the Korean Intellectual Property Office KIPO, the contents of which are herein incorporated by reference in their entireties.

BACKGROUND

1. Field

Example embodiments of the present inventive concept relate to a data driver, a display apparatus including the data driver, and a method of driving a display panel using the display apparatus. More particularly, example embodiments of the present inventive concept relate to a data driver comparing previous line data and present line data to change a parameter of a buffer, a display apparatus including the data driver, and a method of driving a display panel using the display apparatus.

2. Description of the Related Art

Generally, a display apparatus includes a display panel and a display panel driver. The display panel displays an image based on input image data. The display panel includes a plurality of gate lines, a plurality of data lines, and a plurality of pixels. The display panel driver includes a gate driver, a data driver, and a driving controller. The gate driver outputs gate signals to the gate lines. The data driver outputs data voltages to the data lines. The driving controller controls the gate driver and the data driver.

The data driver includes a buffer. The buffer may transmit the data voltage to a pixel circuit within a given time, e.g. 1H time. As a resolution of the display panel increases, the 1H time is shortened and a bias current of the buffer increases to transmit the data voltage to the pixel circuit with the shortened 1H time. When the bias current of the buffer increases, the power consumption of the display apparatus may increase.

SUMMARY

Example embodiments of the present inventive concept provide a data driver comparing previous line data and present line data to change a parameter of a buffer to reduce a power consumption of a display apparatus.

Example embodiments of the present inventive concept also provide a display apparatus including the data driver.

Example embodiments of the present inventive concept also provide a method of driving a display panel using the display apparatus.

In an example embodiment of a data driver according to the present inventive concept, the data driver includes a digital to analog converter, a buffer and a buffer controller. The digital to analog converter is configured to receive a data signal having a digital type and to convert the data signal into a data voltage having an analog type. The buffer is configured to buffer the data voltage and to output the data voltage. The buffer controller is configured to determine a parameter of the buffer based on previous line data of the data signal and present line data of the data signal.

In an example embodiment, the buffer controller may be a subtractor configured to calculate a difference between the previous line data and the present line data.

In an example embodiment, the buffer controller may be configured to determine a bias current based on the previous line data and the present line data.

In an example embodiment, the buffer may include a first current source connected to a first power voltage terminal and a first node and configured to have a first bias current, a second current source connected to the first power voltage terminal and the first node and configured to have a second bias current different from the first bias current and a first switch connected between the second current source and the first node.

In an example embodiment, the buffer may further include a 1-2 current source connected between a second node and a second power voltage terminal and configured to have the first bias current, a 2-2 current source connected between the second node and the second power voltage terminal and configured to have the second bias current, and a 1-2 switch connected between the second node and the 2-2 current source.

In an example embodiment, the buffer may further include a third current source connected to the first power voltage terminal and the first node and configured to have a third bias current different from the first bias current and the second bias current and a second switch connected between the third current source and the first node.

In an example embodiment, the buffer may further include a 3-2 current source connected between the second node and the second power voltage terminal and configured to have the third bias current and a 2-2 switch connected between the second node and the 3-2 current source.

In an example embodiment, the buffer may include a differential input part configured to receive an input voltage, a power supplier configured to provide a bias current to the differential input part, an amplifier configured to amplify the input voltage and an output part configured to output the amplified input voltage as an output voltage.

In an example embodiment, the differential input part may include a first p-type transistor connected to a first input terminal, a first n-type transistor connected to the first input terminal, a second p-type transistor connected to a second input terminal and connected to the first p-type transistor, and a second n-type transistor connected to the second input terminal and connected to the first n-type transistor.

In an example embodiment, the power supplier may include a first current source connected to a first power voltage terminal and a first node and configured to have a first bias current, a second current source connected to the first power voltage terminal and the first node and configured to have a second bias current different from the first bias current, a first switch connected between the second current source and the first node, a 1-2 current source connected between a second node and a second power voltage terminal and configured to have the first bias current, a 2-2 current source connected between the second node and the second power voltage terminal and configured to have the second bias current and a 1-2 switch connected between the second node and the 2-2 current source. The first p-type transistor and the second p-type transistor may be connected at the first node. The first n-type transistor and the second n-type transistor may be connected at the second node.

In an example embodiment, the amplifier may include a seventh p-type transistor and an eighth p-type transistor which are configured to receive a first voltage, a seventh n-type transistor and an eighth n-type transistor which are configured to receive a second voltage, a third p-type transistor and a fifth p-type transistor connected to each other in series between the first power voltage terminal and the seventh p-type transistor, a fourth p-type transistor and a sixth p-type transistor connected to each other in series between the first power voltage terminal and the eighth p-type transistor, a third n-type transistor and a fifth n-type transistor connected to each other in series between the seventh n-type transistor and the second power voltage terminal and a fourth n-type transistor and a sixth n-type transistor connected to each other in series between the eighth n-type transistor and the second power voltage terminal.

In an example embodiment, the output part may include a ninth p-type transistor connected between the first power voltage terminal and an output terminal, a ninth n-type transistor connected between the output terminal and the second power voltage terminal, a first capacitor including a first electrode connected to the fourth p-type transistor and the sixth p-type transistor and a second electrode connected to the output terminal and a second capacitor including a first electrode connected to the fourth n-type transistor and the sixth n-type transistor and a second electrode connected to the output terminal.

In an example embodiment, the data driver may further include a memory configured to receive the present line data, to delay the present line data for one line period to generate the previous line data and to output the previous line data to the buffer controller.

In an example embodiment, the memory may include a flip-flop.

In an example embodiment, the present line data may have N bits. The buffer controller may be configured to compare upper M bits of the present line data and upper M bits of the previous line data. N is a positive integer. M is a positive integer less than N.

In an example embodiment of a display apparatus according to the present inventive concept, the display apparatus includes a display panel, a driving controller, a data driver and a buffer controller. The display panel is configured to display an image based on input image data. The driving controller is configured to generate a data signal having a digital type based on the input image data. The data driver includes a digital to analog converter configured to receive the data signal and to convert the data signal into a data voltage having an analog type and a buffer configured to buffer the data voltage and to output the data voltage to the display panel. The buffer controller is configured to determine a parameter of the buffer based on previous line data of the data signal and present line data of the data signal.

In an example embodiment, the buffer controller may be configured to determine a bias current based on the previous line data and the present line data.

In an example embodiment, the buffer controller may be disposed in the data driver.

In an example embodiment, the buffer controller may be disposed in the driving controller.

In an example embodiment of a method of driving a display panel according to the present inventive concept, the method includes generating a data signal having a digital type based on input image data, determining a bias current of a buffer based on previous line data of the input image data and present line data of the input image data, converting the data signal into a data voltage having an analog type and buffering the data voltage with the buffer by the bias current and outputting the data voltage to the display panel.

According to the data driver, the display apparatus and the method of driving the display panel, the previous line data and the present line data may be compared to change the parameter of the buffer so that the power consumption of the buffer may be reduced and the buffer may have a high slew rate. Thus, the display quality of the display apparatus may be highly maintained while reducing the power consumption of the display apparatus.

In addition, the buffer control circuit for adjusting the parameter of the buffer is disposed at a previous stage of the digital to analog converter so that the buffer control circuit may be implemented as a digital circuit operated by a low voltage. Thus, the increase of the area of the data driver due to the buffer control circuit may be minimized.

BRIEF DESCRIPTION OF THE DRAWINGS

The above and other features of the present inventive concept will become more apparent by describing in detailed example embodiments of the present inventive concept with reference to the accompanying drawings.

FIG. 8 is a table illustrating a bias current of the buffer of FIG. 2 according to the difference between the previous line data and the present line data.

DETAILED DESCRIPTION OF THE INVENTIVE CONCEPT

Hereinafter, the present inventive concept will be explained in detail with reference to the accompanying drawings.

Figure 1:
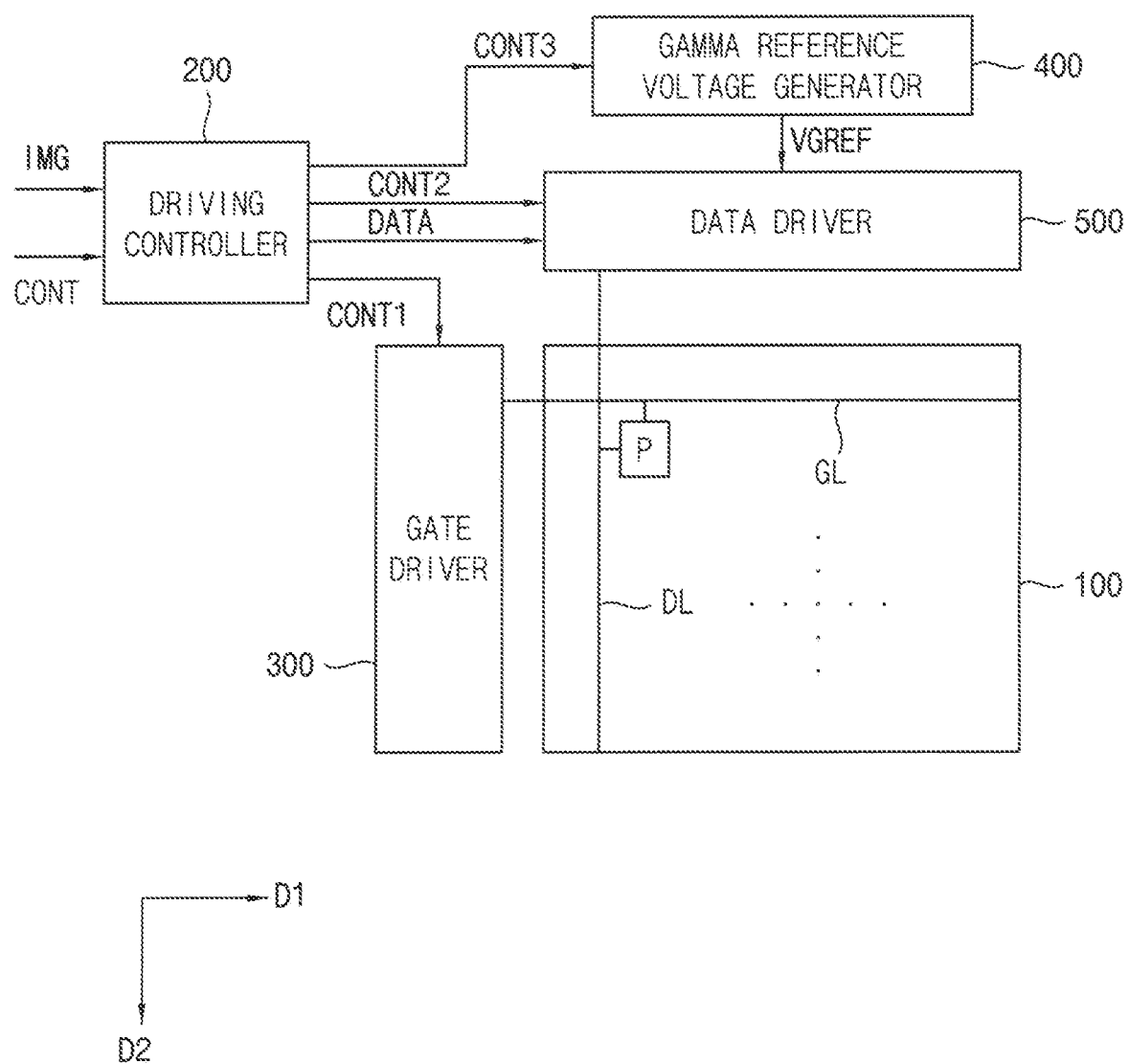
FIG. 1 is a block diagram illustrating a display apparatus according to an example embodiment of the present inventive concept.

FIG. 1 is a block diagram illustrating a display apparatus according to an example embodiment of the present inventive concept.

Referring to FIG. 1, the display apparatus includes a display panel 100 and a display panel driver. The display panel driver includes a driving controller 200, a gate driver 300, a gamma reference voltage generator 400, and a data driver 500.

For example, the driving controller 200 and the data driver 500 may be integrally formed. For example, the driving controller 200, the gamma reference voltage generator 400, and the data driver 500 may be integrally formed. A driving module including at least the driving controller 200 and the data driver 500, which are integrally formed, may be a timing controller embedded data driver (TED).

The display panel 100 has a display region on which an image is displayed and a peripheral region adjacent to the display region.

The display panel 100 includes a plurality of gate lines GL, a plurality of data lines DL, and a plurality of pixels connected to the gate lines GL and the data lines DL. The gate lines GL extend in a first direction D1, and the data lines DL extend in a second direction D2 crossing the first direction D1.

The driving controller 200 receives input image data IMG and an input control signal CONT from an external apparatus. The input image data IMG may include red image data, green image data, and blue image data. The input image data IMG may include white image data. The input image data IMG may include magenta image data, yellow image data, and cyan image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may further include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the driving controller 200. The gate driver 300 outputs the gate signals to the gate lines GL. For example, the gate driver 300 may sequentially output the gate signals to the gate lines GL. For example, the gate driver 300 may be mounted on the peripheral region of the display panel 100. For example, the gate driver 300 may be integrated on the peripheral region of the display panel 100.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an example embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

A structure and an operation of the data driver 500 are explained referring to FIGS. 2 to 8 in detail.

Figure 2:
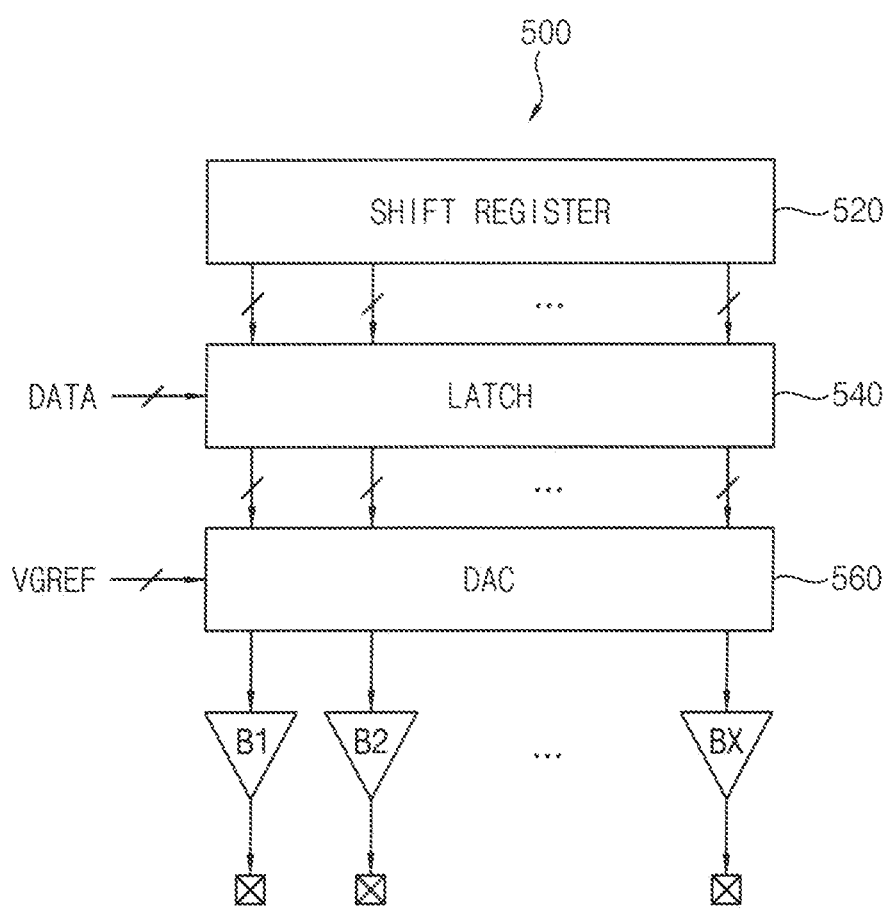
FIG. 2 is a block diagram illustrating a data driver of FIG. 1.

FIG. 2 is a block diagram illustrating the data driver 500 of FIG. 1.

Referring to FIGS. 1 to 2 together, the data driver 500 may include a shift register 520, a latch 540, a digital to analog converter 560 and a plurality of buffers B1 to BX.

The shift register 520 sequentially shifts the data signal DATA.

The latch 540 receives the data signal DATA and temporally stores the data signal DATA.

The digital to analog converter 560 converts the data signal DATA having a digital type to the data voltage having an analog type based on the gamma reference voltage VGREF. The digital to analog converter 560 may include a level shifter for increasing the level of the data signal DATA.

The buffer B1 to BX buffers the data voltage and outputs the data voltage to the data line DL of the display panel 100. The buffers B1 to BX may be connected to the data lines DL in a one-to-one connection. The number of the buffers B1 to BX may be same as the number of the data lines DL.

Figure 3:
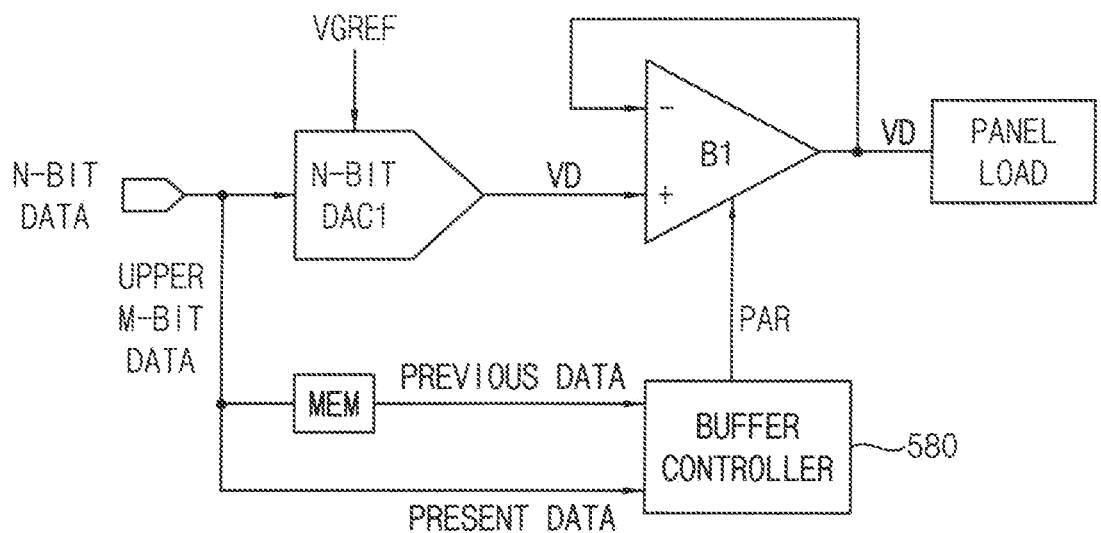
FIG. 3 is a conceptual diagram illustrating a digital to analog converter, a memory, a buffer controller and a buffer of the data driver of FIG. 1.

FIG. 3 is a conceptual diagram illustrating a digital to analog converter N-BIT DAC1, a memory MEM, a buffer controller 580 and the buffer B1 of the data driver 500 of FIG. 1.

Referring to FIGS. 1 to 3, the data driver 500 may include the digital to analog converter N-BIT DAC1, the buffer B1 and the buffer controller 580, sometimes called a buffer controller circuit 580. The digital to analog converter N-BIT DAC1 may receive the data signal, e.g. a data signal N-BIT DATA, having the digital type and convert the data signal, e.g. the data signal N-BIT DATA, to the data voltage VD having the analog type. The buffer B1 may buffer the data voltage VD and output the data voltage VD. The buffer controller 580 may determine a parameter PAR of the buffer B1 based on a previous line data of the data signal, e.g. the data signal N-BIT DATA, and the present line data of the data signal, e.g. the data signal N-BIT DATA.

The buffer controller 580 may output the parameter PAR of the buffer B1 to the buffer B1. The buffer controller circuit 580 may be disposed for each buffer B1 to BX. Thus, the number of the buffer controller circuit 580 may be same as the number of the buffers B1 to BX.

The data driver 500 may further include the memory MEM. The memory MEM may receive the present line data PRESENT DATA and delay the present line data PRESENT DATA for one line period to generate the previous line data PREVIOUS DATA. The memory MEM may output the previous line data PREVIOUS DATA to the buffer controller 580.

For example, the present line data PRESENT DATA may have N bits. For example, the buffer controller 580 may compare upper M bits of the present line data PRESENT DATA and upper M bits of the previous line data PREVIOUS DATA. Herein, the memory MEM may receive the upper M bits of the present line data PRESENT DATA and output the upper M bits of the previous line data PREVIOUS DATA. Herein, N may be a natural number. M may be a natural number less than N.

When the upper M bits of the present line data PRESENT DATA are compared to the upper M bits of the previous line data PREVIOUS DATA, a difference between the present line data PRESENT DATA and the previous line data PREVIOUS DATA may be determined using a small load. When the upper M bits of the present line data PRESENT DATA are compared to the upper M bits of the previous line data PREVIOUS DATA, the size of the memory MEM may be reduced and the power consumption for operating the buffer controller 580 may be reduced.

Alternatively, the buffer controller 580 may compare N bits of the present line data PRESENT DATA and N bits of the previous line data PREVIOUS DATA. If there are no limitations of the size of the memory MEM and the load or the power consumption due to the operation of the buffer controller 580, the buffer controller 580 may compare the N bits of the present line data PRESENT DATA and the N bits of the previous line data PREVIOUS DATA so that the parameter of the buffer B1 may be more precisely controlled.

Figure 4:
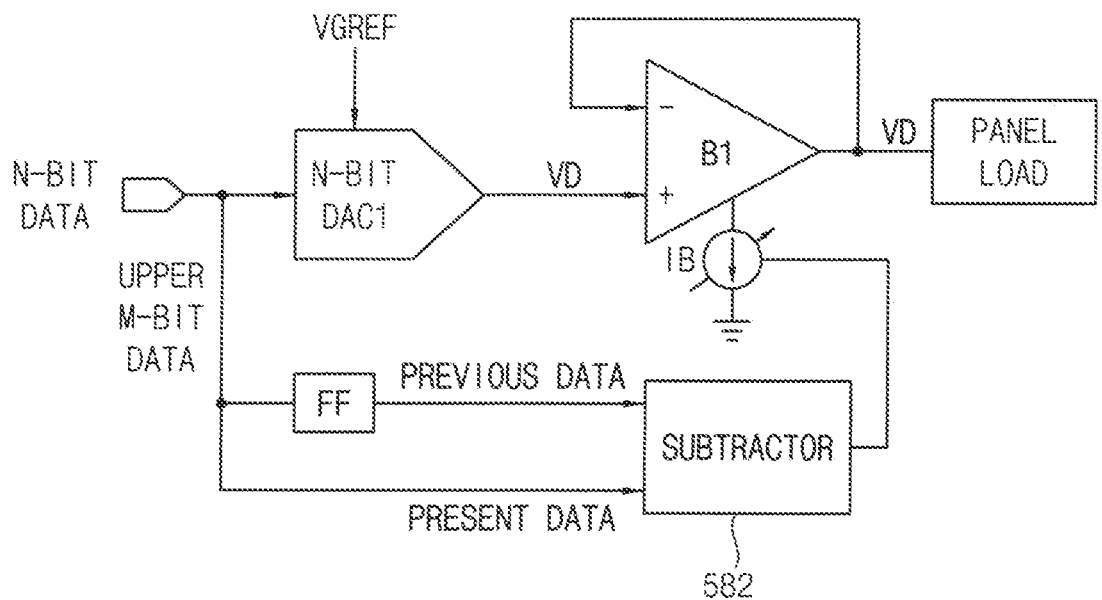
FIG. 4 is a conceptual diagram illustrating the digital to analog converter, a flip-flop, a subtractor and the buffer of the data driver of FIG. 1.

FIG. 4 is a conceptual diagram illustrating the digital to analog converter N-BIT DAC1, a flip-flop FF, a subtractor 582 and the buffer B1 of the data driver 500 of FIG. 1. FIG. 4 may illustrate a circuit including specific examples of the elements of FIG. 3.

Referring to FIGS. 1 to 4, an example of a buffer controller may be the subtractor 582 calculating the difference between the previous line data PREVIOUS DATA and the present line data PRESENT DATA. For example, the subtractor 582 may calculate an absolute value of the difference between the previous line data PREVIOUS DATA and the present line data PRESENT DATA. The subtractor 582 may determine a bias current IB of the buffer B1 based on the absolute value of the difference between the previous line data PREVIOUS DATA and the present line data PRESENT DATA.

The buffer B1 may have the bias current IB varied according to the previous line data PREVIOUS DATA and the present line data PRESENT DATA. For example, as the absolute value of the difference between the previous line data PREVIOUS DATA and the present line data PRESENT DATA increases, the bias current IB of the buffer B1 corresponding to the present line data PRESENT DATA may increase. In contrast, as the absolute value of the difference between the previous line data PREVIOUS DATA and the present line data PRESENT DATA decreases, the bias current IB of the buffer B1 corresponding to the present line data PRESENT DATA may decrease.

For example, a memory may be the flip-flop FF. The size of the flip-flop FF may correspond to the upper M bits of the present line data PRESENT DATA.

Figure 5:
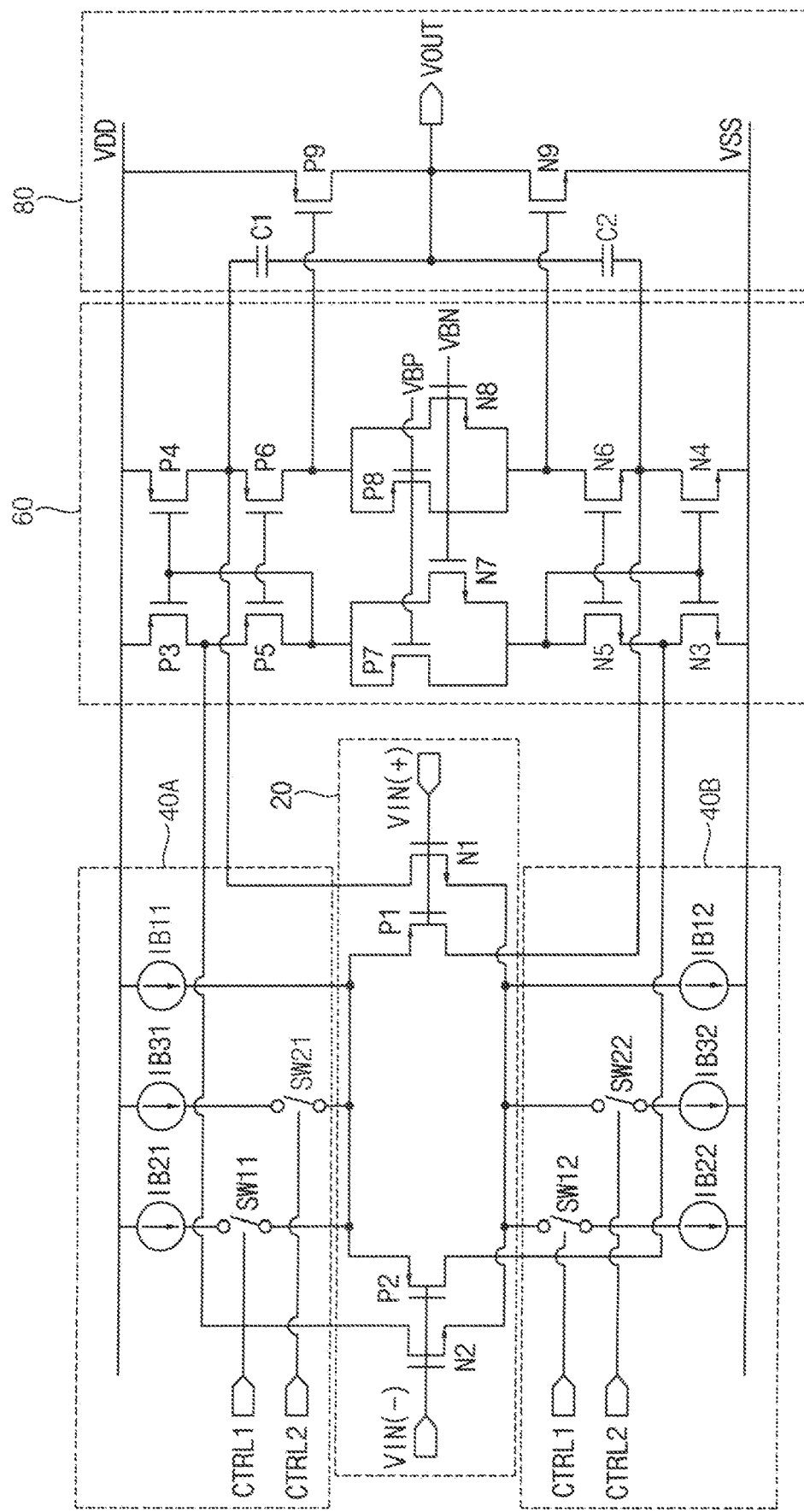
FIG. 5 is a circuit diagram illustrating the buffer of FIG. 2.

FIG. 5 is a circuit diagram illustrating the buffer B1 of FIG. 2.

Referring to FIGS. 1 to 5, the buffer, e.g. buffer B1, may include a differential input part 20, a power supplier 40A and 40B, an amplifier 60 and an output part 80.

The differential input part 20 may receive an input voltage VIN(+) and VIN(−). The input voltage VIN(+) and VIN(−) may have a differential type.

The power supplier 40A and 40B may provide the bias current IB to the differential input part 20.

The amplifier 60 may receive the input voltage VIN(+) and VIN(−) from the differential input part 20 and amplify the input voltage VIN(+) and VIN(−).

The output part 80 may output the amplified input voltage as an output voltage VOUT.

The differential input part 20 may include a first p-type transistor P1 connected to a first input terminal receiving a first differential input voltage VIN(+), and a first n-type transistor N1 connected to the first input terminal. The differential input part 20 may further include a second p-type transistor P2 connected to a second input terminal receiving a second differential input voltage VIN(−) and connected to the first p-type transistor P1 and a second n-type N2 transistor connected to the second input terminal and connected to the first n-type transistor N1.

The power supplier 40A and 40B may include a first current source IB11 connected between a first power voltage terminal receiving a first power voltage VDD and a first node, a second current source IB21 connected between the first power voltage terminal and the first node and a first switch SW11 connected between the second current source IB21 and the first node. The first current source IB11 may have a first bias current. The second current source IB21 may have a second bias current different from the first bias current.

For example, the first bias current of the first current source IB11 may be represented as a first bias current IB1 and the second bias current of the second current source IB21 may be represented as a second bias current IB2. For example, the first bias current IB1 may be greater than the second bias current IB2.

The first switch SW11 may be turned on and off by a first switching control signal CTRL1 of the buffer controller 580. When the first switch SW11 is turned off, the bias current of the buffer B1 may be the first bias current IB1. When the first switch SW11 is turned on, the bias current of the buffer B1 may be a sum IB1+IB2 of the first bias current IB1 and the second bias current IB2.

The power supplier 40A and 40B may further include a 1-2 current source IB12 connected between a second node and a second power voltage terminal receiving a second power voltage VSS, a 2-2 current source IB22 connected between the second node and the second power voltage terminal and a 1-2 switch SW12 connected between the second node and the 2-2 current source IB22. The 1-2 current source IB12 may have the first bias current IB1. The 2-2 current source IB22 may have the second bias current IB2.

The 1-2 switch SW12 may be controlled by the first switching control signal CTRL1 same as the first switch SW11.

Suitably, the current IB1 of the first current source IB11 and the 1-2 current source IB12 may be the same as each other. However, practically, the current IB1 of the first current source IB11 and the 1-2 current source IB12 may be slightly different from each other.

Suitably, the current IB2 of the second current source IB21 and the 2-2 current source IB22 may be the same as each other. However, practically, the current IB2 of the second current source IB21 and the 2-2 current source IB22 may be slightly different from each other.

In the present example embodiment, the power supplier 40A and 40B may further include a third current source IB31 connected between the first power voltage terminal and the first node and a second switch SW21 connected between the third current source IB31 and the first node. The third current source IB31 may have a third bias current IB3 different from the first bias current IB1 and the second bias current IB2.

For example, the third bias current IB3 may be less than the first bias current IB1 and the second bias current IB2.

The second switch SW21 may be turned on and off by a second switching control signal CTRL2 of the buffer controller 580. When the second switch SW21 is turned off, the bias current of the buffer B1 may be the first bias current IB1. When the second switch SW11 is turned on, the bias current of the buffer B1 may be a sum IB1+IB3 of the first bias current IB1 and the third bias current IB3.

When both of the first switch SW11 and the second switch SW21 are turned on, the bias current of the buffer B1 may be a sum IB1+IB2+IB3 of the first bias current IB1, the second bias current IB2 and the third bias current IB3.

In the present example embodiment, the buffer B1 may further include a 3-2 current source IB32 connected between the second node and the second power voltage terminal and a 2-2 switch SW22 connected between the second node and the 3-2 current source IB32. The 3-2 current source IB32 may have the third bias current IB3.

The 2-2 switch SW22 may be controlled by the second switching control signal CTRL2 same as the second switch SW21.

Suitably, the current IB3 of the third current source IB31 and the 3-2 current source IB32 may be the same as each other. However, practically, the current IB3 of the third current source IB31 and the 3-2 current source IB32 may be slightly different from each other.

The amplifier 60 may include a seventh p-type transistor P7 and an eighth p-type transistor P8 which receive a first voltage VBP, a seventh n-type transistor N7 and an eighth n-type transistor N8 which receive a second voltage VBN. The amplifier 60 may further include a third p-type transistor P3 and a fifth p-type transistor P5 which are connected to each other in series between the first power voltage terminal and the seventh p-type transistor P7. The amplifier 60 may further include a fourth p-type transistor P4 and a sixth p-type transistor P6 which are connected to each other in series between the first power voltage terminal and the eighth p-type transistor P8. The amplifier 60 may further include a third n-type transistor N3 and a fifth n-type transistor N5 which are connected to each other in series between the seventh n-type transistor N7 and the second power voltage terminal. The amplifier 60 may further include a fourth n-type transistor N4 and a sixth n-type transistor N6 which are connected to each other in series between the eighth n-type transistor N8 and the second power voltage terminal.

The output part 80 may include a ninth p-type transistor P9 connected between the first power voltage terminal and an output terminal outputting the output voltage VOUT and a ninth n-type transistor connected between the output terminal and the second power voltage terminal.

The output part 80 may further include a first capacitor C1 including a first electrode connected to the fourth p-type transistor P4 and the sixth p-type transistor P6 and a second electrode connected to the output terminal. The output part 80 may further include a second capacitor C2 including a first electrode connected to the fourth n-type transistor N4 and the sixth n-type transistor N6 and a second electrode connected to the output terminal.

Figure 6:
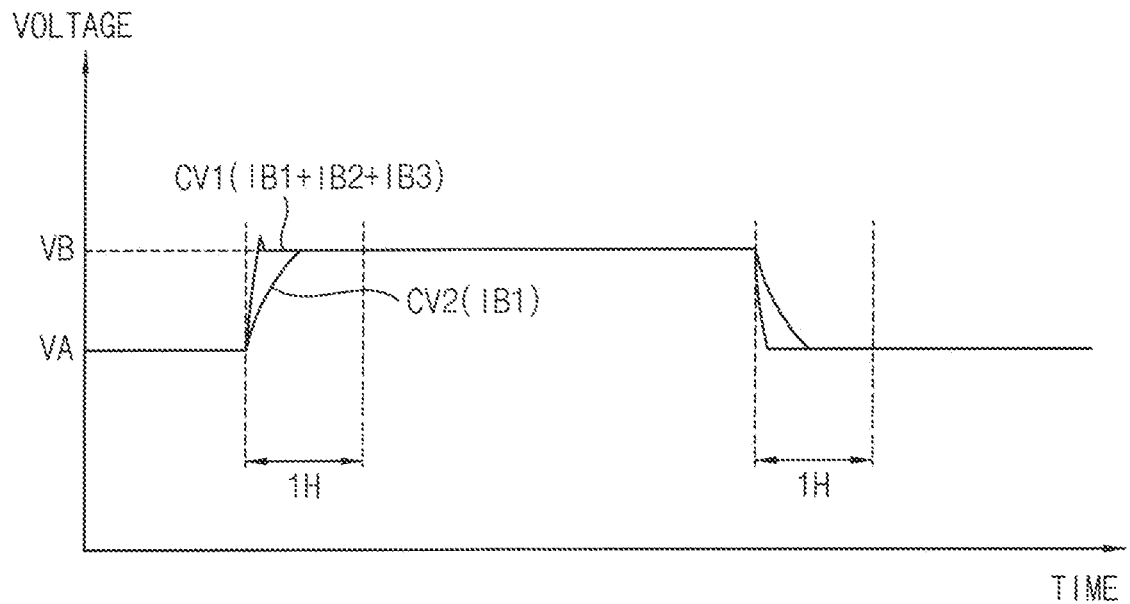
FIG. 6 is a conceptual diagram illustrating a waveform of a data voltage outputted from the buffer of FIG. 2 when a difference between previous line data and present line data is little.
Figure 7:
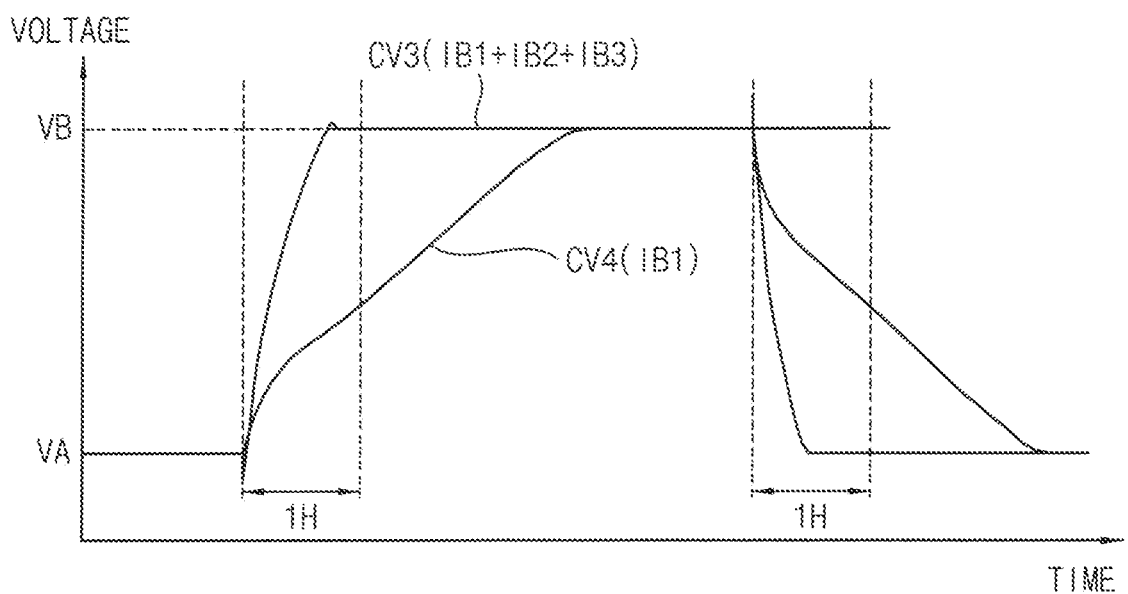
FIG. 7 is a conceptual diagram illustrating a waveform of the data voltage outputted from the buffer of FIG. 2 when the difference between the previous line data and the present line data is great.

FIG. 6 is a conceptual diagram illustrating a waveform of the data voltage VD outputted from the buffer of FIG. 2 when a difference between previous line data VA and present line data VB is little. In one embodiment, the previous line data VA and the present line data VB of FIGS. 6 and 7 is the same data as the previous line data PREVIOUS DATA and the present line data PRESENT DATA as described above in FIGS. 3 and 4. FIG. 7 is a conceptual diagram illustrating a waveform of the data voltage VD outputted from the buffer of FIG. 2 when the difference between the previous line data VA and the present line data VB is great. FIG. 8 is a table illustrating a bias current IB of the buffer of FIG. 2 according to the difference between the previous line data VA and the present line data VB.

In FIG. 6, a first curve CV1 represents the data voltage when the bias current IB is set to a sum IB1+IB2+IB3 of a first bias current IB1, a second bias current IB2 and a third bias current IB3 and a second curve CV2 represents the data voltage when the bias current IB is set to the first bias current IB1.

In FIG. 7, a third curve CV3 represents the data voltage when the bias current IB is set to a sum IB1+IB2+IB3 of a first bias current IB1, a second bias current IB2 and a third bias current IB3 and a fourth curve CV4 represents the data voltage when the bias current IB is set to the first bias current IB1.

In FIG. 6, the absolute value of the difference between the previous line data VA and the present line data VB is little so that the data voltage may be sufficiently transmitted to the pixel with a 1H period even if the bias current IB is set to be little, e.g., see the curve CV2.

For example, in FIG. 6, the bias current IB may be set to the first bias current IB1 and the first switch SW11, the 1-2 switch SW12, the second switch SW21 and the 2-2 switch SW22 in FIG. 5 may be turned off.

In contrast, in FIG. 7, the absolute value of the difference between the previous line data VA and the present line data VB is great so that the data voltage may not be sufficiently transmitted to the pixel with a 1H period if the bias current IB is set to be little, e.g., see the curve CV4.

For example, in FIG. 7, the bias current IB may be set to the sum of the first bias current IB1, the second bias current IB2 and the third bias current IB3 and the first switch SW11, the 1-2 switch SW12, the second switch SW21 and the 2-2 switch SW22 in FIG. 5 may be turned on.

FIG. 8 represents an example of setting the bias current IB of the buffer according to the absolute value of the previous line data VA and the present line data VB.

When the absolute value of the previous line data VA and the present line data VB is equal to or less than VDD/4, the bias current IB may be set to the first bias current IB1.

When the absolute value of the previous line data VA and the present line data VB is greater than VDD/4 and equal to or less than VDD/2, the bias current IB may be set to the sum IB1+IB2 of the first bias current IB1 and the second bias current IB2.

When the absolute value of the previous line data VA and the present line data VB is greater than VDD/2 and equal to or less than 3VDD/4, the bias current IB may be set to the sum IB1+IB3 of the first bias current IB1 and the second bias current IB3.

When the absolute value of the previous line data VA and the present line data VB is greater than 3VDD/4, the bias current IB may be set to the sum IB1+IB2+IB3 of the first bias current IB1, the second bias current IB2 and the second bias current IB3.

According to the present example embodiment, the previous line data and the present line data may be compared to change the parameter of the buffer so that the power consumption of the buffer may be reduced and the buffer may have a high slew rate. Thus, the display quality of the display apparatus may be highly maintained while reducing the power consumption of the display apparatus.

In addition, the buffer control circuit for adjusting the parameter of the buffer is disposed at a previous stage of the digital to analog converter so that the buffer control circuit may be implemented as a digital circuit operated by a low voltage. Thus, the increase of the area of the data driver due to the buffer control circuit may be minimized.

Figure 9:
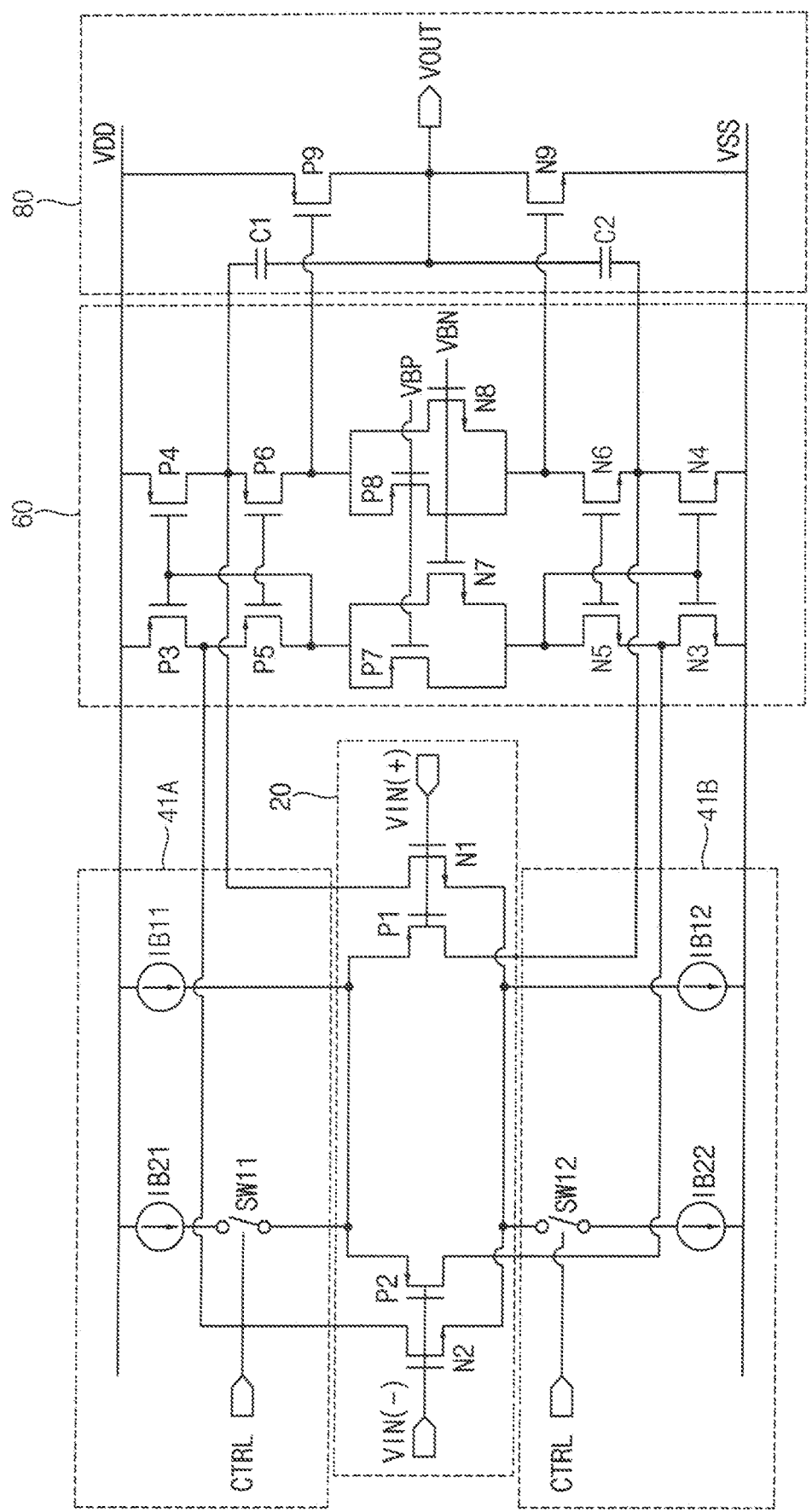
FIG. 9 is a circuit diagram illustrating a buffer of a display apparatus according to an example embodiment of the present inventive concept.

FIG. 9 is a circuit diagram illustrating a buffer of a display apparatus according to an example embodiment of the present inventive concept.

The data driver, the display apparatus, and the method of driving the display panel according to the present example embodiment is substantially the same as the data driver, the display apparatus, and the method of driving the display panel of the previous example embodiment explained referring to FIGS. 1 to 8 except for the structure of the power supplier of the buffer. Thus, the same reference numerals will be used to refer to the same or like parts as those described in the previous example embodiment of FIGS. 1 to 8 and any repetitive explanation concerning the above elements will be omitted.

Referring to FIGS. 1 to 4 and 9, the buffer, e.g. buffer B1, may include a differential input part 20, a power supplier 41A and 41B, an amplifier 60, and an output part 80.

The differential input part 20 may receive an input voltage VIN(+) and VIN(−). The input voltage VIN(+) and VIN(−) may have a differential type.

The power supplier 41A and 41B may provide the bias current IB to the differential input part 20.

The amplifier 60 may receive the input voltage VIN(+) and VIN(−) from the differential input part 20 and amplify the input voltage VIN(+) and VIN(−).

The output part 80 may output the amplified input voltage as an output voltage VOUT.

The differential input part 20 may include a first p-type transistor P1 connected to a first input terminal receiving a first differential input voltage VIN(+), and a first n-type transistor N1 connected to the first input terminal. The differential input part 20 may further include a second p-type transistor P2 connected to a second input terminal receiving a second differential input voltage VIN(−) and connected to the first p-type transistor P1 and a second n-type transistor N2 connected to the second input terminal and connected to the first n-type transistor N1.

The power supplier 41A and 41B may include a first current source IB11 connected between a first power voltage terminal receiving a first power voltage VDD and a first node, a second current source IB21 connected between the first power voltage terminal and the first node and a first switch SW11 connected between the second current source IB21 and the first node. The first current source IB11 may have a first bias current. The second current source IB21 may have a second bias current different from the first bias current.

For example, the first bias current of the first current source IB11 may be represented as a first bias current IB1 and the second bias current of the second current source IB21 may be represented as a second bias current IB2. For example, the first bias current IB1 may be greater than the second bias current IB2.

The first switch SW11 may be turned on and off by a first switching control signal CTRL of the buffer controller 580. When the first switch SW11 is turned off, the bias current of the buffer B1 may be the first bias current IBL When the first switch SW11 is turned on, the bias current of the buffer B1 may be a sum IB1+IB2 of the first bias current IB1 and the second bias current IB2.

The power supplier 41A and 41B may further include a 1-2 current source IB12 connected between a second node and a second power voltage terminal receiving a second power voltage VSS, a 2-2 current source IB22 connected between the second node and the second power voltage terminal and a 1-2 switch SW12 connected between the second node and the 2-2 current source IB22. The 1-2 current source IB12 may have the first bias current IB1. The 2-2 current source IB22 may have the second bias current IB2.

The 1-2 switch SW12 may be controlled by the first switching control signal CTRL same as the first switch SW11.

Suitably, the current IB1 of the first current source IB11 and the 1-2 current source IB12 may be the same as each other. However, practically, the current IB1 of the first current source IB11 and the 1-2 current source IB12 may be slightly different from each other.

Suitably, the current IB2 of the second current source IB21 and the 2-2 current source IB22 may be the same as each other. However, practically, the current IB2 of the second current source IB21 and the 2-2 current source IB22 may be slightly different from each other.

According to the present example embodiment, the previous line data and the present line data may be compared to change the parameter of the buffer so that the power consumption of the buffer may be reduced and the buffer may have a high slew rate. Thus, the display quality of the display apparatus may be highly maintained while reducing the power consumption of the display apparatus.

In addition, the buffer control circuit for adjusting the parameter of the buffer is disposed at a previous stage of the digital to analog converter so that the buffer control circuit may be implemented as a digital circuit operated by a low voltage. Thus, the increase of the area of the data driver due to the buffer control circuit may be minimized.

Figure 10:
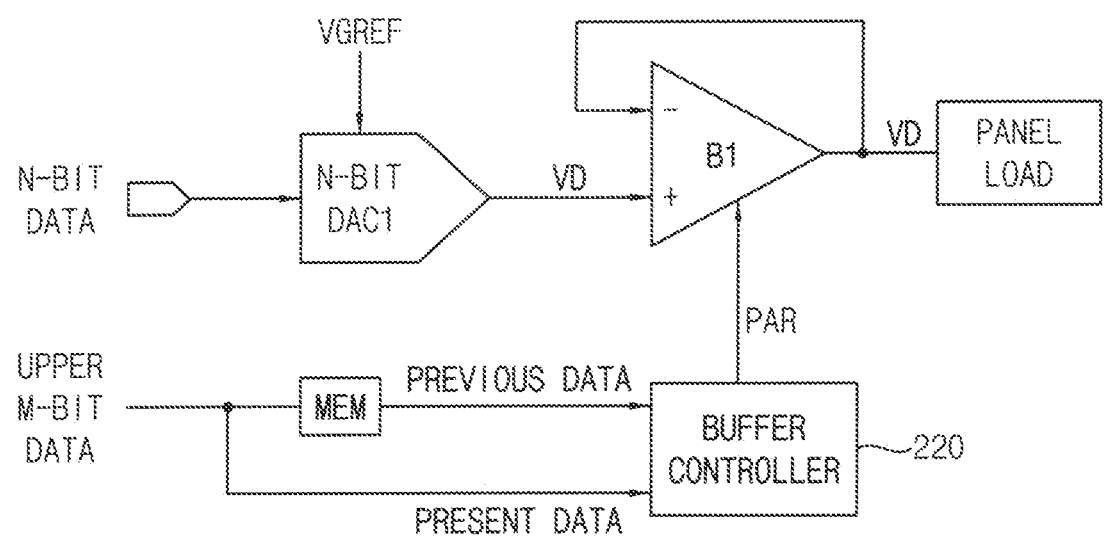
FIG. 10 is a conceptual diagram illustrating a digital to analog converter and a buffer of a data driver and a memory and a buffer controller of a display apparatus according to an example embodiment of the present inventive concept.

FIG. 10 is a conceptual diagram illustrating a digital to analog converter and a buffer of a data driver and a memory and a buffer controller of a display apparatus according to an example embodiment of the present inventive concept.

The data driver, the display apparatus, and the method of driving the display panel according to the present example embodiment is substantially the same as the data driver, the display apparatus, and the method of driving the display panel of the previous example embodiment explained referring to FIGS. 1 to 8 except that the memory and the buffer controller are disposed in the driving controller. Thus, the same reference numerals will be used to refer to the same or like parts as those described in the previous example embodiment of FIGS. 1 to 8 and any repetitive explanation concerning the above elements will be omitted.

Referring to FIGS. 1, 2 and 10, the display apparatus includes a display panel 100 and a display panel driver. The display panel driver includes a driving controller 200, a gate driver 300, a gamma reference voltage generator 400 and a data driver 500.

The data driver 500 may include a shift register 520, a latch 540, a digital to analog converter 560, and a plurality of buffers B1 to BX.

The shift register 520 sequentially shifts the data signal DATA.

The latch 540 receives the data signal DATA and temporally stores the data signal DATA.

The digital to analog converter 560 converts the data signal DATA having a digital type to the data voltage having an analog type based on the gamma reference voltage VGREF. The digital to analog converter 560 may include a level shifter for increasing the level of the data signal DATA.

The buffer B1 to BX buffers the data voltage and outputs the data voltage to the data line DL of the display panel 100. The buffers B1 to BX may be connected to the data lines DL in a one-to-one connection. The number of the buffers B1 to BX may be same as the number of the data lines DL.

The data driver 500 may include the digital to analog converter N-BIT DAC1 and the buffer B1. The digital to analog converter N-BIT DAC1 may receive the data signal, e.g. a data signal N-BIT DATA, having the digital type and convert the data signal, e.g. the data signal N-BIT DATA, to the data voltage VD having the analog type. The buffer B1 may buffer the data voltage VD and output the data voltage VD.

The display apparatus may include a buffer controller 220, sometimes called a buffer controller circuit 220. The buffer controller 220 may determine a parameter PAR of the buffer B1 based on a previous line data of the data signal, e.g. the data signal N-BIT DATA, and the present line data of the data signal, e.g. the data signal N-BIT DATA.

The buffer controller 220 may output the parameter PAR of the buffer B1 to the buffer B1.

In the present example embodiment, the buffer controller 220 may be disposed in the driving controller 200.

According to the present example embodiment, the previous line data and the present line data may be compared to change the parameter of the buffer so that the power consumption of the buffer may be reduced and the buffer may have a high slew rate. Thus, the display quality of the display apparatus may be highly maintained while reducing the power consumption of the display apparatus.

In addition, the buffer control circuit for adjusting the parameter of the buffer is disposed at a previous stage of the digital to analog converter so that the buffer control circuit may be implemented as a digital circuit operated by a low voltage. Thus, the increase of the area of the data driver due to the buffer control circuit may be minimized.

According to the present example embodiment, the power consumption of the display apparatus may be reduced.

The foregoing is illustrative of the present inventive concept and is not to be construed as limiting. Although a few example embodiments of the present inventive concept have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific example embodiments disclosed, and that modifications to the disclosed example embodiments, as well as other example embodiments, are intended to be included within the scope of the appended claims. The present inventive concept is defined by the following claims, with equivalents of the claims to be included in the present inventive concept.

What is claimed is:

1. A data driver comprising:
    a digital to analog converter configured to receive a data signal having a digital type and to convert the data signal into a data voltage having an analog type;
    a buffer configured to buffer the data voltage and to output the data voltage, wherein the buffer comprises:
    a first current source connected to a first power voltage terminal and a first node and configured to have a first bias current;
    a second current source connected to the first power voltage terminal and the first node and configured to have a second bias current different from the first bias current; and
    a first switch connected between the second current source and the first node; and
    a buffer controller configured to determine a parameter of the buffer based on previous line data of the data signal and present line data of the data signal.

2. The data driver of claim 1, wherein the buffer controller is a subtractor configured to calculate a difference between the previous line data and the present line data.

3. The data driver of claim 1, wherein the buffer controller is configured to determine a bias current based on the previous line data and the present line data.

4. The data driver of claim 1, wherein the buffer further comprises:
    a 1-2 current source connected between a second node and a second power voltage terminal and configured to have the first bias current;
    a 2-2 current source connected between the second node and the second power voltage terminal and configured to have the second bias current; and
    a 1-2 switch connected between the second node and the 2-2 current source.

5. The data driver of claim 4, wherein the buffer further comprises:
    a third current source connected to the first power voltage terminal and the first node and configured to have a third bias current different from the first bias current and the second bias current; and
    a second switch connected between the third current source and the first node.

6. The data driver of claim 5, wherein the buffer further comprises:
    a 3-2 current source connected between the second node and the second power voltage terminal and configured to have the third bias current; and
    a 2-2 switch connected between the second node and the 3-2 current source.

7. A data driver comprising:
    a digital to analog converter configured to receive a data signal having a digital type and to convert the data signal into a data voltage having an analog type;
    a buffer configured to buffer the data voltage and to output the data voltage; and
    a buffer controller configured to determine a parameter of the buffer based on previous line data of the data signal and present line data of the data signal, wherein the buffer comprises:
    a differential input part configured to receive an input voltage;
    a power supplier configured to provide a bias current to the differential input part;
    an amplifier configured to amplify the input voltage; and an output part configured to output the amplified input voltage as an output voltage, wherein the differential input part comprises:
a first p-type transistor connected to a first input terminal;
a first n-type transistor connected to the first input terminal;
a second p-type transistor connected to a second input terminal and connected to the first p-type transistor; and
a second n-type transistor connected to the second input terminal and connected to the first n-type transistor, wherein the power supplier comprises:
a first current source connected to a first power voltage terminal and a first node and configured to have a first bias current;
a second current source connected to the first power voltage terminal and the first node and configured to have a second bias current different from the first bias current;
a first switch connected between the second current source and the first node;
a 1-2 current source connected between a second node and a second power voltage terminal and configured to have the first bias current;
a 2-2 current source connected between the second node and the second power voltage terminal and configured to have the second bias current; and
a 1-2 switch connected between the second node and the 2-2 current source,
wherein the first p-type transistor and the second p-type transistor are connected at the first node, and
wherein the first n-type transistor and the second n-type transistor are connected at the second node.

8. The data driver of claim 7, wherein the amplifier comprises:
a seventh p-type transistor and an eighth p-type transistor which are configured to receive a first voltage;
a seventh n-type transistor and an eighth n-type transistor which are configured to receive a second voltage;
a third p-type transistor and a fifth p-type transistor connected to each other in series between the first power voltage terminal and the seventh p-type transistor;
a fourth p-type transistor and a sixth p-type transistor connected to each other in series between the first power voltage terminal and the eighth p-type transistor;
a third n-type transistor and a fifth n-type transistor connected to each other in series between the seventh n-type transistor and the second power voltage terminal; and
a fourth n-type transistor and a sixth n-type transistor connected to each other in series between the eighth n-type transistor and the second power voltage terminal.

9. The data driver of claim 8, wherein the output part comprises:
a ninth p-type transistor connected between the first power voltage terminal and an output terminal;
a ninth n-type transistor connected between the output terminal and the second power voltage terminal;
a first capacitor including a first electrode connected to the fourth p-type transistor and the sixth p-type transistor and a second electrode connected to the output terminal; and
a second capacitor including a first electrode connected to the fourth n-type transistor and the sixth n-type transistor and a second electrode connected to the output terminal.

10. The data driver of claim 1, further comprising a memory configured to receive the present line data, to delay the present line data for one line period to generate the previous line data and to output the previous line data to the buffer controller.

11. The data driver of claim 10, wherein the memory comprises a flip-flop.

12. The data driver of claim 1, wherein the present line data have N bits,
wherein the buffer controller is configured to compare upper M bits of the present line data and upper M bits of the previous line data,
wherein N is a positive integer, and
wherein M is a positive integer less than N.

13. A display apparatus comprising:
a display panel configured to display an image based on input image data;
a driving controller configured to generate a data signal having a digital type based on the input image data;
a data driver comprising a digital to analog converter configured to receive the data signal and to convert the data signal into a data voltage having an analog type and a buffer configured to buffer the data voltage and to output the data voltage to the display panel, wherein the buffer comprises:
a first current source connected to a first power voltage terminal and a first node and configured to have a first bias current;
a second current source connected to the first power voltage terminal and the first node and configured to have a second bias current different from the first bias current; and
a first switch connected between the second current source and the first node; and
a buffer controller configured to determine a parameter of the buffer based on previous line data of the data signal and present line data of the data signal.

14. The display apparatus of claim 13, wherein the buffer controller is configured to determine a bias current based on the previous line data and the present line data.

15. The display apparatus of claim 14, wherein the buffer controller is disposed in the data driver.

16. The display apparatus of claim 14, wherein the buffer controller is disposed in the driving controller.

17. A method of driving a display panel, the method comprising:
generating a data signal having a digital type based on input image data;
determining a bias current of a buffer based on previous line data of the input image data and present line data of the input image data, wherein the buffer comprises:
a first current source connected to a first power voltage terminal and a first node and having a first bias current;
a second current source connected to the first power voltage terminal and the first node and having a second bias current different from the first bias current; and
a first switch connected between the second current source and the first node;
converting the data signal into a data voltage having an analog type; and
buffering the data voltage with the buffer by the bias current and outputting the data voltage to the display panel.

* * * * *